US012284895B2

(12) United States Patent
Hu et al.

(10) Patent No.: US 12,284,895 B2
(45) Date of Patent: Apr. 22, 2025

(54) DISPLAY SUBSTRATE, MANUFACTURING METHOD THEREFOR, AND DISPLAY APPARATUS

(71) Applicant: BOE TECHNOLOGY GROUP CO., LTD., Beijing (CN)

(72) Inventors: Chunjing Hu, Beijing (CN); Qing Dai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 446 days.

(21) Appl. No.: 17/776,960

(22) PCT Filed: May 11, 2021

(86) PCT No.: PCT/CN2021/093145
§ 371 (c)(1),
(2) Date: May 13, 2022

(87) PCT Pub. No.: WO2021/238645
PCT Pub. Date: Dec. 2, 2021

(65) Prior Publication Data
US 2022/0399408 A1    Dec. 15, 2022

(30) Foreign Application Priority Data
May 27, 2020 (CN) .......................... 202010463812.5

(51) Int. Cl.
H01L 27/32     (2006.01)
H10K 50/84     (2023.01)
(Continued)

(52) U.S. Cl.
CPC ........... *H10K 59/35* (2023.02); *H10K 50/841* (2023.02); *H10K 71/00* (2023.02); *H10K 71/135* (2023.02)

(58) Field of Classification Search
None
See application file for complete search history.

(56) References Cited

U.S. PATENT DOCUMENTS

2002/0084747 A1    7/2002   Fujieda et al.
2002/0101152 A1    8/2002   Kimura
(Continued)

FOREIGN PATENT DOCUMENTS

CN    1365247 A     8/2002
CN    107968110 A   4/2018
(Continued)

OTHER PUBLICATIONS

The First Office Action for the Chinese Patent Application No. 202010463812.5 issued by the Chinese Patent Office on Mar. 11, 2022.
(Continued)

*Primary Examiner* — William C Trapanese
(74) *Attorney, Agent, or Firm* — XSENSUS LLP

(57) ABSTRACT

A display substrate includes a substrate, a planarization layer disposed on a side of the substrate, and a plurality of light-emitting layers disposed on a side of the planarization layer away from the substrate. The planarization layer includes a plurality of first portions and a second portion, a first portion is disposed in a sub-pixel region, and the second portion is located in a gap region between a plurality of sub-pixel regions; side surfaces of the plurality of first portions and side surfaces of the second portion have spacings therebetween to form a plurality of annular depressions, and an annular depression surrounds a first portion. A light-emitting layer covers the first portion of the planarization layer.

16 Claims, 11 Drawing Sheets

(51) Int. Cl.
  *H10K 59/35*  (2023.01)
  *H10K 71/00*  (2023.01)
  *H10K 71/13*  (2023.01)

(56) References Cited

U.S. PATENT DOCUMENTS

| | | |
|---|---|---|
| 2005/0023969 A1 | 2/2005 | Omata et al. |
| 2016/0111688 A1* | 4/2016 | Lee .................. H10K 71/00 438/34 |
| 2018/0184501 A1* | 6/2018 | Park .................. H05B 33/22 |
| 2019/0157629 A1 | 5/2019 | Wang |

FOREIGN PATENT DOCUMENTS

| | | |
|---|---|---|
| CN | 108242458 A | 7/2018 |
| CN | 109888119 A | 6/2019 |
| CN | 109950292 A | 6/2019 |
| CN | 110660839 A | 1/2020 |
| CN | 111584601 A | 8/2020 |

OTHER PUBLICATIONS

The Second Office Action for the Chinese Patent Application No. 202010463812.5 issued by the Chinese Patent Office on Aug. 8, 2022.

* cited by examiner

DISPLAY SUBSTRATE, MANUFACTURING METHOD THEREFOR, AND DISPLAY APPARATUS

CROSS-REFERENCE TO RELATED APPLICATIONS

The present disclosure is a national phase entry under 35 USC 371 of International Patent Application No. PCT/CN2021/093145, filed on May 11, 2021, which claims priority to Chinese Patent Application No. 202010463812.5, filed on May 27, 2020, which are incorporated herein by reference in their entirety.

TECHNICAL FIELD

The present disclosure relates to the field of display technologies, and in particular, to a display substrate, a manufacturing method therefor, and a display apparatus.

BACKGROUND

Organic light-emitting diode (OLED) display panels have gradually become a mainstream in the display field due to their excellent properties such as low power consumption, high color saturation, wide viewing angle, thin thickness and flexibility, and the OLED display panels may be widely used in terminal products such as smart phones, tablet computers, or televisions.

SUMMARY

In an aspect, a display substrate is provided. The display substrate has a plurality of sub-pixel regions. The display substrate includes a substrate, a planarization layer disposed on a side of the substrate, and a plurality of light-emitting layers disposed on a side of the planarization layer away from the substrate. The planarization layer includes a plurality of first portions and a second portion. A first portion is disposed in a sub-pixel region, and the second portion is located in a gap region between the plurality of sub-pixel regions. A side surface of the first portion and a side surface of the second portion have a spacing therebetween to form an annular depression, and the annular depression surrounds the first portion. A light-emitting layer covers the first portion of the planarization layer.

In some embodiments, an edge of the light-emitting layer is located within the annular depression.

In some embodiments, an orthogonal projection of an edge of the light-emitting layer on the substrate substantially coincides with an orthogonal projection of an edge of the first portion on the substrate.

In some embodiments, a material of the planarization layer includes a lyophobic material.

In some embodiments, the display substrate further includes a lyophobic material layer covering at least a portion of an inner surface of the annular depression proximate to the second portion.

In some embodiments, the lyophobic material layer covers the entire inner surface of the annular depression.

In some embodiments, the display substrate further includes a first electrode located between the planarization layer and the light-emitting layer.

In some embodiments, an edge of the first electrode is located in the annular depression.

In some embodiments, an orthogonal projection of an edge of the first electrode on the substrate substantially coincides with an orthogonal projection of an edge of the first portion on the substrate.

In some embodiments, a material of the first electrode includes a lyophilic material.

In some embodiments, a section of the annular depression is in a shape of an inverted trapezoid, and a length of a bottom base of the inverted trapezoid proximate to the substrate is less than a length of a top base of the inverted trapezoid away from the substrate.

In some embodiments, a section of the annular depression is in a shape of a trapezoid, and a length of a bottom base of the trapezoid proximate to the substrate is greater than a length of a top base of the trapezoid away from the substrate.

In some embodiments, a surface of the first portion away from the substrate and a side surface of the annular depression proximate to the first portion have a rounded corner.

In some embodiments, a bottom surface of the annular depression and a surface of the planarization layer proximate to the substrate have a distance therebetween.

In some embodiments, a ratio of a depth of the annular depression to a thickness of the light-emitting layer is in a range from approximately 1.5 to approximately 5.

In another aspect, a display apparatus is provided. The display apparatus includes the display substrate according to any one of the above embodiments.

In yet another aspect, a manufacturing method for a display substrate is provided. The method includes: providing a substrate; the substrate having a plurality of sub-pixel regions; forming a planarization film on a side of the substrate; patterning the planarization film to form a plurality of annular depressions in the planarization film to obtain a planarization layer; wherein the planarization layer is divided into a plurality of first portions and a second portion by the plurality of annular depressions, an annular depression surrounds a first portion, the first portion is disposed in a sub-pixel region, and the second portion is located in a gap region between the plurality of sub-pixel regions; and forming a plurality of light-emitting layers on a side of the planarization layer away from the substrate; a light-emitting layer covering the first portion of the planarization layer.

In some embodiments, forming the plurality of light-emitting layers on the side of the planarization layer away from the substrate includes: inkjet printing luminescent material ink on the side of the planarization layer away from the substrate; and drying the luminescent material ink to form the plurality of light-emitting layers.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
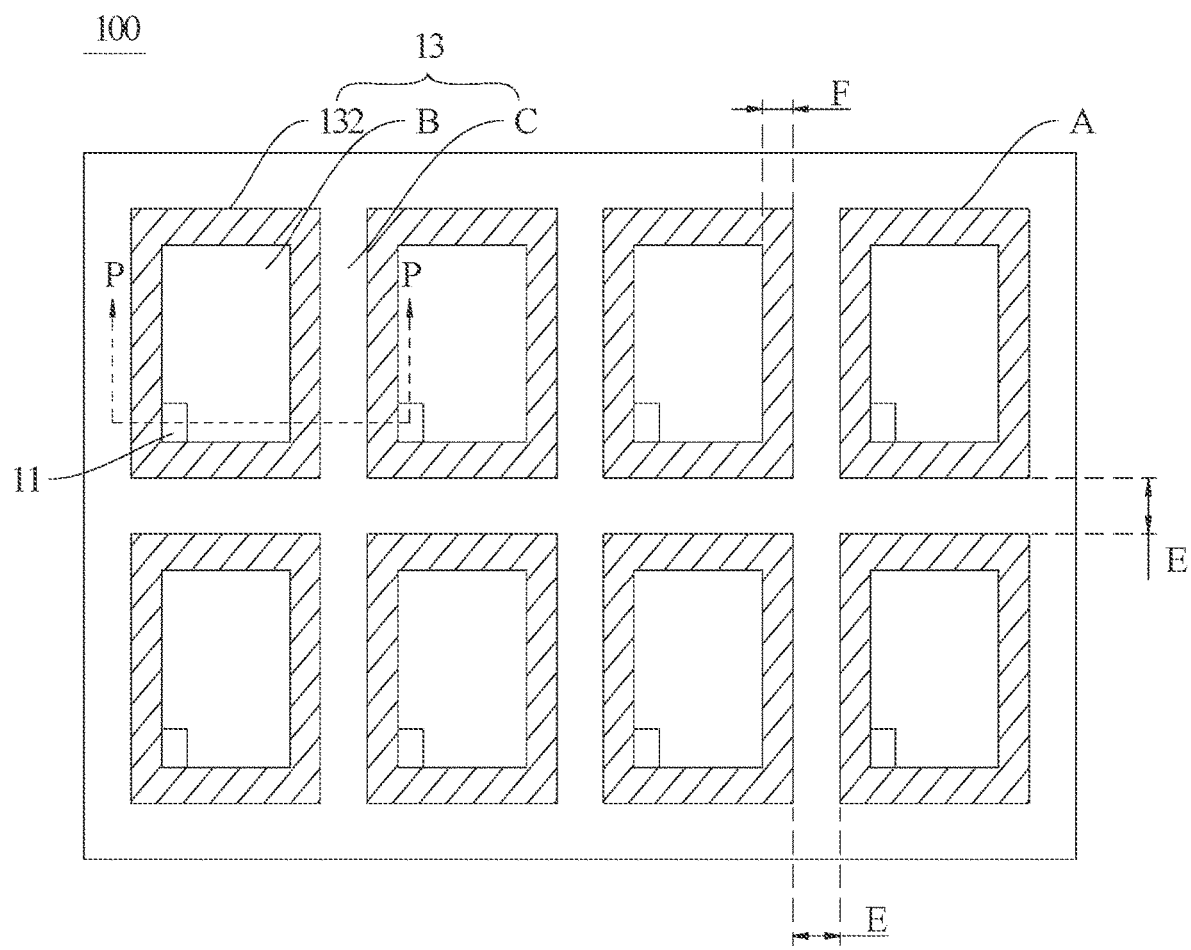
FIG. 1 is a top view of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The use of the phase "applicable to" or "configured to" herein means an open and inclusive language, which does not exclude devices that are applicable to or configured to perform additional tasks or steps.

In addition, the phrase "based on" used herein has an open and inclusive meaning, since a process, step, calculation, or other action that is "based on" one or more of the stated conditions or values may, in practice, be based on additional conditions or values beyond those stated.

The term "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown as a rectangle generally has a feature of being curved. Therefore, the regions shown in the accompanying drawings are schematic in nature, and their shapes are not intended to show actual shapes of regions in a device, and are not intended to limit the scope of the exemplary embodiments.

Film forming processes of the OLED display panels mainly include an evaporation process and a solution process. The evaporation process is relatively mature in application of small-size OLED display panels, and this technology has been applied in mass production. The solution process mainly includes inkjet printing, nozzle coating, spin coating, and screen printing. The inkjet printing process has a high material utilization rate, may achieve large-scale production, and is considered to be one of important processes for mass production of large-size OLED display panels.

In some examples, the inkjet printing process is used to form films. However, a light-emitting layer formed by this process has a problem of non-uniform thickness, which leads to non-uniform or loss of color of light emitted from the light-emitting layer, and affect display quality of an OLED display panel.

As mentioned above, in a case where the light-emitting layer is formed by the inkjet printing process, the light-emitting layer has the problem of non-uniform thickness. One of reasons of the above problem is as follows.

Figure 23:
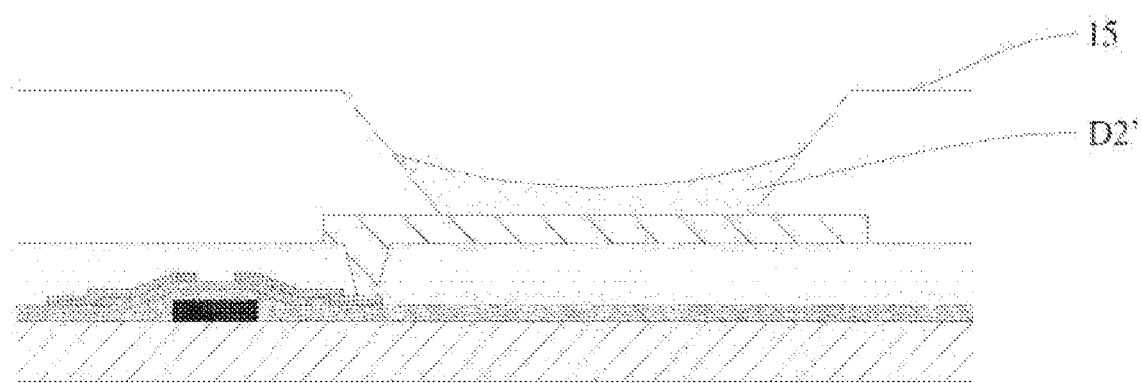
FIGS. 23 and 24 are partial sectional views of a display substrate in the related arts.
Figure 24:
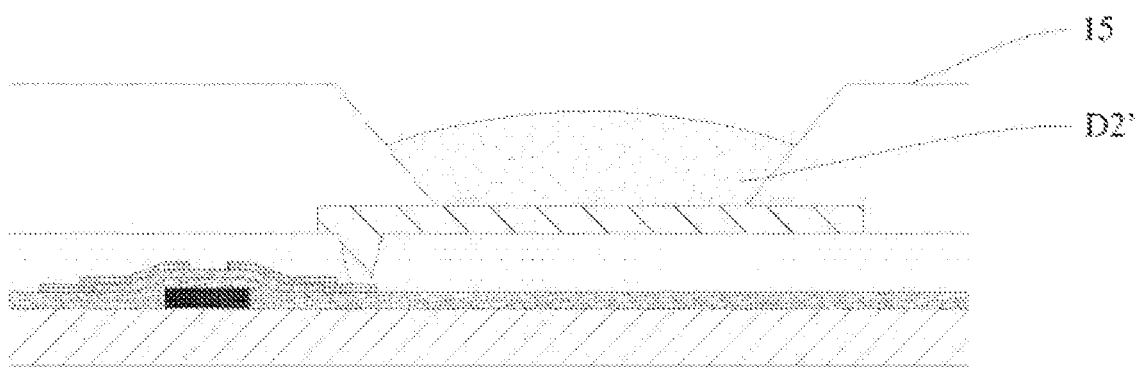

A light-emitting layer D2' is formed by the inkjet printing process. During a drying process of ink of a luminescent material, as shown in FIG. 23, if sidewalls of barrier walls 15 of a pixel defining layer (PDL) are lyophilic, the ink may climb along the sidewalls of the barrier walls 15, so as to form the light-emitting layer D2' that is thin in middle and thick at edges; as shown in FIG. 24, if the sidewalls of the barrier walls 15 of the pixel definition layer are lyophobic, the ink may collect in middle of an open region between the barrier walls 15, so as to form the light-emitting layer D2' that is thin at the edges and thick in the middle. Therefore, whether the sidewalls of the barrier walls 15 of the pixel defining layer are lyophobic or lyophobic, a thickness of the light-emitting layer D2' is non-uniform.

Based on this, some embodiments of the present disclosure provide a display substrate 100. The display substrate 100 has a plurality of sub-pixel regions A. FIG. 1 shows a top view of the display substrate 100, and FIGS. 2 to 5 show partial sectional views of the display substrate 100 taken along the line P-P. In some embodiments, the display substrate 100 includes a substrate 10 and a plurality of pixel driving circuits disposed on a side of the substrate 10. A sub-pixel region A is provided with a pixel driving circuit therein. Each pixel driving circuit includes a plurality of thin film transistors 11. In some embodiments, each thin film transistor 11 includes a gate 111, an active layer 112, a source 113, and a drain 114. For example, a gate insulating layer 12 is provided between the active layer 112 and the gate 111.

In some embodiments, as shown in FIGS. 1 to 6, and 8, the display substrate 100 further includes a planarization layer 13 covered on sides of the plurality of pixel driving circuits away from the substrate 10.

In some embodiments, as shown in FIGS. 1 to 6, and 8, the planarization layer 13 includes a plurality of first portions B and a second portion C. A first portion B is disposed in a sub-pixel region A, and the second portion C is located in a gap region E between the plurality of sub-pixel regions A. A side surface of a first portion B and a side surface of the second portion C have a spacing F therebetween to form an annular depression 132, and the annular depression 132 surrounds the first portion B.

In some embodiments, as shown in FIGS. 2 to 6, and 8, each first portion B of the planarization layer 13 has a via hole 131, so that a light-emitting device D is electrically connected to the thin film transistor 11 through the via hole 131.

In some other embodiments, as shown in FIGS. 2 to 6, and 8, the display substrate 100 further includes a passivation layer 14 disposed between the planarization layer 13 and the pixel driving circuits. In this case, the via hole 131 in the planarization layer 13 further penetrates the passivation layer 14, so that the light-emitting device D is electrically connected to the thin film transistor 11 through the via hole 131 penetrating both the planarization layer 13 and the passivation layer 14.

In some embodiments, as shown in FIGS. 2 to 6, and 8, the display substrate 100 further includes a plurality of light-emitting devices D disposed on a side of the planarization layer 13 away from the substrate 10. A light-emitting device D is disposed in a sub-pixel region A. Each light-emitting device D includes a first electrode D1, a light-emitting layer D2 and a second electrode D3.

The first electrode D1 of the light-emitting device D is located between the planarization layer 13 and the light-emitting layer D2, and the first electrode D1 is electrically connected the source 113 or the drain 114 of the thin film transistor 11 which is a driving transistor in the plurality of thin film transistors 11 included in the pixel driving circuit through the via hole 131 in the first portion B of the planarization layer 13 (the figures show a case where the first electrode D1 is electrically connected the drain 114). The light-emitting layer D2 and the second electrode D3 are sequentially disposed on a side of the first electrode D1 away from the substrate 10. The light-emitting layer D2 may be formed by an inkjet printing process. The first electrode D1 may be, for example, an anode; the second electrode D3 may be, for example, a cathode.

In some other embodiments, the light-emitting device D further includes one or more of an electron transporting layer (ETL), an electron injection layer (EIL), a hole transporting layer (HTL) and a hole injection layer (HIL) in addition to the light-emitting layer D2, so as to improve luminous efficiency of the light-emitting device D.

By the pixel driving circuit 102, a voltage is applied to the first electrode D1 of the light-emitting device D, and another voltage is applied to the second electrode D3 of the light-emitting device D, so that a voltage difference is formed between the first electrode D1 and the second electrode D3, and the light-emitting layer D2 in the light-emitting device D is driven to emit light, and thus a display apparatus may display images.

In the embodiments of the present disclosure, the pixel definition of the display substrate 100 does not use a pixel definition layer, but forms the plurality of annular depressions 132 in the planarization layer 13 to form the plurality of first portions B each located within the annular depression 132, and the second portion C located between the plurality of sub-pixel regions A. In a case where the light-emitting layer D2 of the light-emitting device D is formed by the inkjet printing process, a luminescent material ink is sprayed on a side of the first portion B away from the substrate 10; since the luminescent material ink is in contact with a flat surface, a phenomenon that the luminescent material ink shrinks inward or climbs along the sidewalls of the barrier walls 15 of the pixel definition layer in the related arts may be avoided, so that the light-emitting layer D2 with a relatively uniform thickness is formed. As a result, the uniformity of the color of the light emitted from the light-emitting layer D2 is improved.

Figure 2:
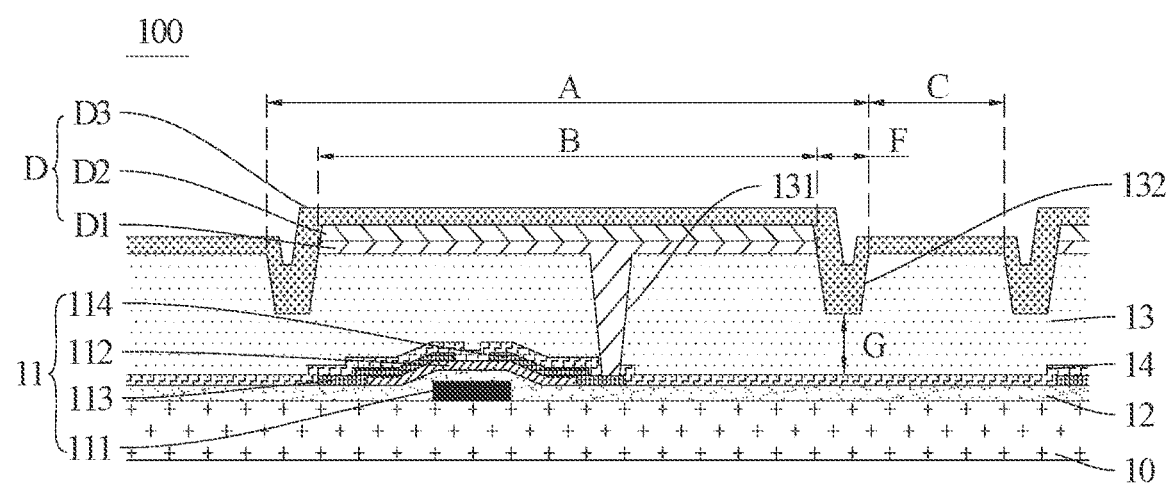
FIG. 2 is a partial sectional view taken along the P-P line in FIG. 1.
Figure 3:
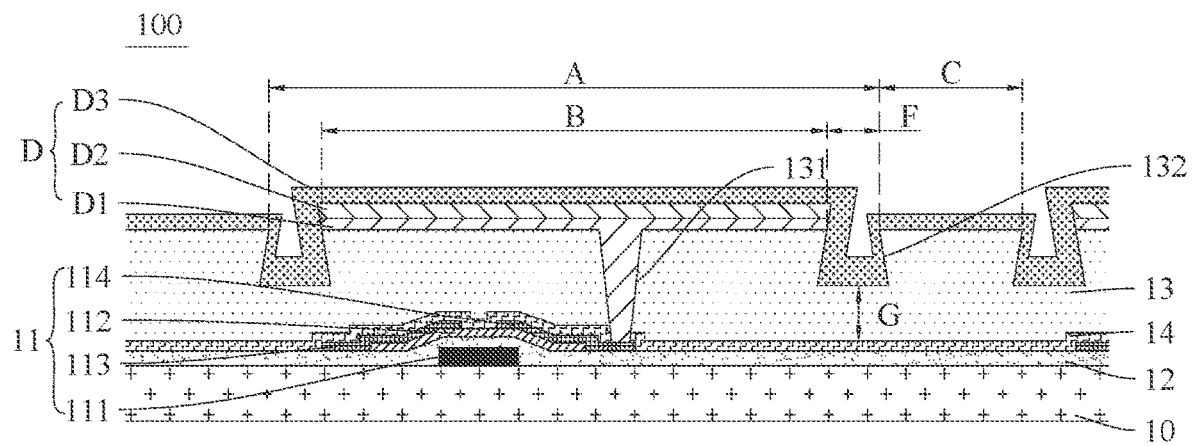
FIG. 3 is a partial sectional view of another display substrate, in accordance with some embodiments of the present disclosure.

For example, as shown in FIGS. 2 and 3, an orthogonal projection of an edge of the first electrode D1 on the substrate 10 coincides or substantially coincides with an orthogonal projection of an edge of the first portion B on the substrate 10, and an orthogonal projection of an edge of the light-emitting layer D2 on the substrate 10 coincides or substantially coincides with the orthogonal projection of the edge of the first portion B on the substrate 10, and the light-emitting layer D2 covers the first electrode D1.

By means of the above arrangement, in a case where the orthogonal projections of the edges of the first electrode D1 and the light-emitting layer D2 on the substrate 10 coincide or substantially coincide with the orthogonal projection of the edge of the first portion B on the substrate 10, a light-emitting region of the light-emitting device D is located in a range of the first portion B, so as to ensure that a luminous area of the light-emitting device D is approximately equal to an area of the orthogonal projection of the first portion B on the substrate 10, in this way, the entire light-emitting layer D2 may be formed on a flat surface formed by the first portion B, so that a film layer of the light-emitting layer D2 is relatively flat.

It will be noted that the "substantially coincide" refers to that there are process errors between shapes and areas of the first electrode D1 and the light-emitting layer D2 limited by manufacturing processes of the first electrode D1 and the light-emitting layer D2, and it may not be possible to ensure that the orthogonal projections of the edges of the first electrode D1 and the light-emitting layer D2 on the substrate 10 coincide exactly with the orthogonal projection of the edge of the first portion B on the substrate 10.

Figure 4:
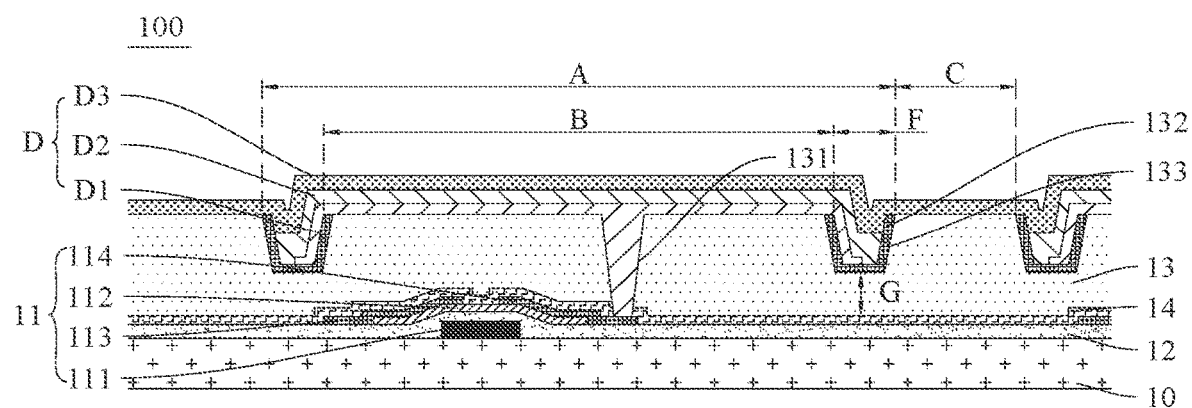
FIG. 4 is a partial sectional view of yet another display substrate, in accordance with some embodiments of the present disclosure.
Figure 5:
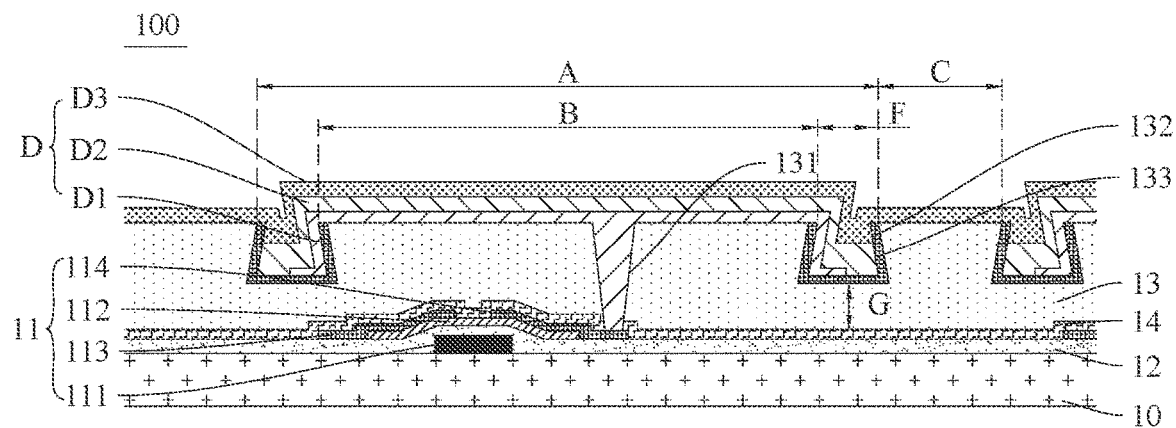
FIG. 5 is a partial sectional view of yet another display substrate, in accordance with some embodiments of the present disclosure.
Figure 6:
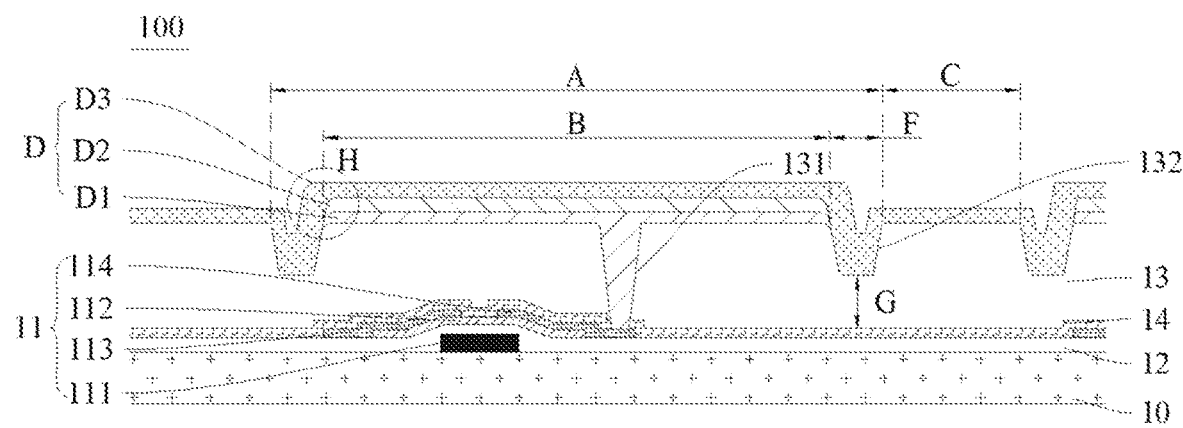
FIG. 6 is a partial sectional view of yet another display substrate, in accordance with some embodiments of the present disclosure.
Figure 7:
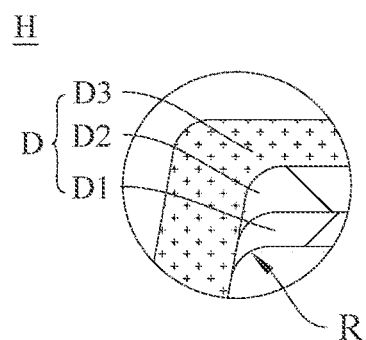
FIG. 7 is an enlarged view of region H in FIG. 6.
Figure 8:
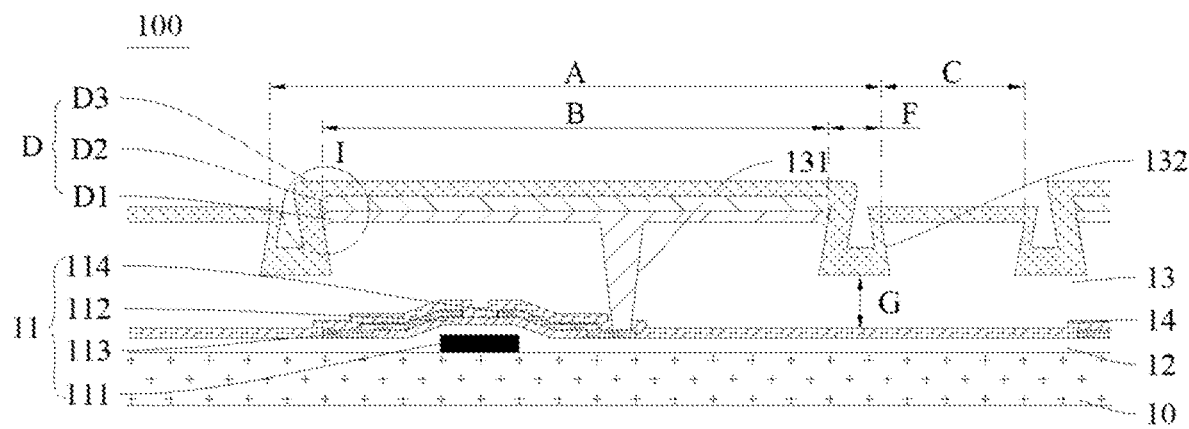
FIG. 8 is a partial sectional view of yet another display substrate, in accordance with some embodiments of the present disclosure.
Figure 9:
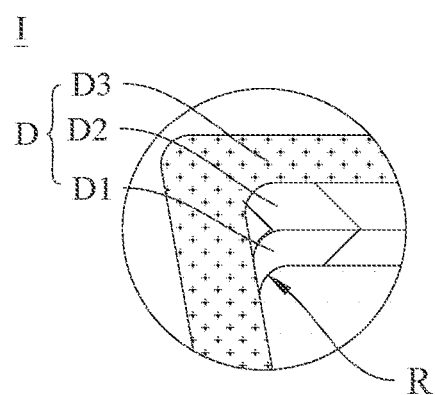
FIG. 9 is an enlarged view of region I in FIG. 8.

For example, as shown in FIGS. 4 and 5, the edge of the first electrode D1 is located in the annular depression 132, the edge of the light-emitting layer D2 is also located in the annular depression 132, and the light-emitting layer D2 covers the first electrode D1.

By means of the above arrangement, in a case where the edges of the first electrode D1 and the light-emitting layer D2 extend into the annular depression 132, the light-emitting region of the light-emitting device D extends into the annular depression 132, so that the luminous area of the light-emitting device D is increased.

In some embodiments, a material of the planarization layer includes a lyophobic material. Alternatively, as shown in FIGS. 4 and 5, the display substrate 100 further includes a lyophobic material layer 133. The lyophobic material layer 133 covers at least a portion of an inner surface of the annular depression 132 proximate to the second portion C; for example, the lyophobic material layer 133 covers the entire inner surface of the annular depression 132, which will not be limited in the embodiments of the present disclosure.

The lyophobic material used for the planarization layer 13 or a material of the lyophobic material layer 133 may include at least one of fluorinated polyimide, or poly(methyl methacrylate).

In the embodiments of the present disclosure, in a case where the light-emitting layer D2 is manufactured by the inkjet printing process, the luminescent material ink is sprayed on a surface of the first electrode D1 away from the substrate 10; since the luminescent material ink has fluidity and is affected by gravity, a certain amount of the luminescent material ink may flow into the annular depression 132, and the annular depression 132 is used to receive the flowing luminescent material ink. The luminescent material ink flowing into the annular depression 132 is affected by the lyophobic material layer 133, so that the phenomenon that the luminescent material ink climbs along the sidewall of the annular depression 132 proximate to the second portion C may be attenuated, and the luminescent material ink is prevented from flowing over the annular depression 132 onto the second portion C.

In addition, the luminescent material ink flowing into the annular depression 132 is dried, so that the edge of the light-emitting layer D2 is located in the annular depression 132. As a result, light-emitting layers D2 of two adjacent sub-pixel regions A are disconnected, so as to achieve an effect of pixel definition.

For example, as shown in FIGS. 2 and 4, a section of the annular depression 132 is in a shape of an inverted trapezoid, and a length of a bottom base of the inverted trapezoid proximate to the substrate 10 is less than a length of a top base away from the substrate 10. That is, a width of the top of the annular depression 132 is greater than a width of the bottom of the annular depression 132. Therefore, a corner of the first portion B away from the substrate 10 is an obtuse angle, which is beneficial for the luminous material ink to flow into the annular depression 132, and a receiving effect of the annular depression 132 is improved.

For example, as shown in FIGS. 3 and 5, the section of the annular depression 132 is in a shape of a trapezoid, and a length of a bottom base of the trapezoid proximate to the substrate 10 is greater than a length of a top base away from the substrate 10. That is, a width of the top of the annular depression 132 is less than a width of the bottom of the annular depression 132. Therefore, the corner of the first portion B away from the substrate 10 is an acute angle, and in turn, the phenomenon that the luminescent material ink climbs along the sidewalls of the annular depression 132 is further attenuated.

In addition, the luminescent material ink is dried, so that the edge of the light-emitting layer D2 is located in the annular depression 132; since the corner of the first portion B away from the substrate 10 is the acute angle, the light-emitting layers D2 of the two adjacent sub-pixel regions may be disconnected more easily, and the pixel definition effect may be further improved.

In some embodiments, as shown in FIGS. 2 to 5, a bottom surface of the annular depression 132 and a surface of the planarization layer 13 proximate the substrate 10 have a distance G therebetween, so as to prevent the annular depression 132 from penetrating the planarization layer 13, thereby preventing the luminescent material ink from flowing into the pixel driving circuit located under the planarization layer 13 through the annular depression 132.

In some embodiments, a ratio of a depth of the annular depression 132 to a thickness of the light-emitting layer D2 is in a range from approximately 1.5 to approximately 5, so as to ensure that the luminescent material ink required to form the light-emitting layer D2 does not overflow the annular depression 132. For example, the thickness of the light-emitting layer D2 is 0.2 µm, and the depth of the annular depression 132 is in a range of 0.3 µm to 1 µm, inclusive. For example, the depth of the annular depression 132 is 0.3 µm, 0.6 µm or 1 µm. In this way, the ratio of the depth of the annular depression 132 to the thickness of the light-emitting layer D2 is 1.5, 3 or 5.

In some embodiments, in order to ensure continuity of a film layer of the second electrode D3, so that the second electrode D3 does not break in the annular depression 132, the above purpose may be achieved by at least one of reducing the depth of the annular depression 132, increasing the angle of the corner of the first portion B away from the substrate 10, setting the corner (i.e., a corner constituted by a surface of the first portion B away from the substrate and a side surface of the annular depression 132 proximate to the first portion B) of the first portion B away from the substrate 10 as rounded corners R (as shown in FIGS. 6 to 9), or increasing a thickness of the film layer of the second electrode D3.

For example, in a case where the section of the annular depression 132 is in the shape of the trapezoid, and the depth of the annular depression 132 is in a range of 0.3 μm to 1 μm, inclusive, the angle of the corner of the first portion B away from the substrate 10 is in a range of 60° to 90° (excluding 90°), so that the second electrode D3 may not break in the annular depression 132, and a good continuity of the second electrode D3 is ensured.

In some embodiments, a material of the first electrode D1 includes a lyophilic material, such as acrylic acid. The luminescent material ink is sprayed on the surface of the first electrode D1, the luminescent material ink has an affinity with the surface of the first electrode D1 due to an action of the lyophilic material, which is beneficial for the luminescent material ink to be attached to the surface of the first electrode D1. As a result, the uniformity of the thickness of the light-emitting layer D2 formed after drying is improved.

Figure 10:
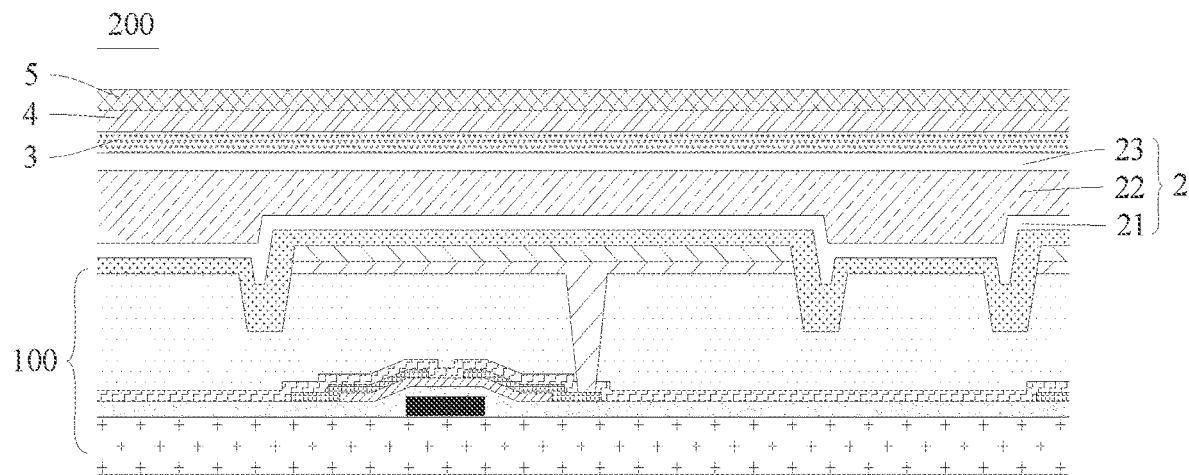
FIG. 10 is a partial sectional view of a display apparatus, in accordance with some embodiments of the present disclosure.

Some embodiments of the present disclosure provide a display apparatus 200, as shown in FIG. 10, the display apparatus 200 may be an electroluminescent display apparatus, the electroluminescent display apparatus may be an organic light-emitting diode (OLED) display apparatus or a quantum dot light-emitting diode (QLED) display apparatus.

The display apparatus 200 includes the display substrate 100. The pixel definition of the display substrate 100 does not use a pixel definition layer, but forms the plurality of annular depressions 132 in the planarization layer 13 to form the plurality of first portions B each located within the annular depression 132, and the second portion C located between the plurality of sub-pixel regions A. In a case where a film is formed by the inkjet printing process, the luminescent material ink is sprayed on the side of the first portion B away from the substrate 10; since the luminescent material ink is in contact with a flat surface, the phenomenon that the luminescent material ink shrinks inward or climbs along the sidewalls of the barrier walls 15 of the pixel definition layer in the related arts may be avoided, so that the light-emitting layer D2 with a relatively uniform thickness is formed. As a result, the uniformity of the color of the light emitted from the light-emitting layer D2 is improved, and in turn, the display effect of the display apparatus 200 is improved.

The display apparatus 200 may be a top-emission display apparatus. In this case, the first electrode D1 proximate to the substrate 10 is opaque, and the second electrode D3 away from the substrate 10 is transparent or translucent, so that light is emitted from the light-emitting layer D2, and exits in the direction away from the substrate 10 through the second electrode D3. The display apparatus 200 may also be a bottom-emission display apparatus. In this case, the first electrode D1 proximate to the substrate 10 is transparent or translucent, the second electrode D3 away from the substrate 10 is opaque, so that the light is emitted from the light-emitting layer D2, and exits in the direction proximate to the substrate 10 through the first electrode D1.

In some embodiments, the electroluminescent display apparatus further includes an encapsulation structure. The encapsulation structure may be an encapsulation film or an encapsulation substrate. In a case where the encapsulation structure is the encapsulation film, as shown in FIG. 10, the electroluminescent display apparatus further includes an encapsulation layer 2.

The encapsulation layer 2 is used for encapsulating the display substrate 100, and includes at least a first inorganic barrier layer 21, an organic barrier layer 22 and a second inorganic barrier layer 23. The first inorganic barrier layer 21 is in contact with a surface of the display substrate 100, the organic barrier layer 22 is formed on a side of the first inorganic barrier layer 21 away from the display substrate 100, and the second inorganic barrier layer 23 is formed on a side of the organic barrier layer 22 away from the first inorganic barrier layer 21.

The first inorganic barrier layer 21 and the second inorganic barrier layer 23 have a function of blocking moisture and oxygen, and the organic barrier layer 22 has a certain flexibility and a function of absorbing moisture. Therefore, the formed encapsulation layer 2 may enable the display substrate 100 to achieve a good encapsulation effect, and a phenomenon of encapsulation failure is less likely to occur.

In some embodiments, as shown in FIG. 10, the electroluminescent display apparatus further includes components such as a polarizer 3, an optically clear adhesive (OCA) 4 and a cover plate glass 5.

The display apparatus 200 may be any apparatus that displays an image whether in motion (e.g., a video) or stationary (e.g., a still image), and whether textual or graphical. More specifically, it is anticipated that the embodiments may be implemented in a variety of electronic apparatuses or associated with a variety of electronic apparatuses. The variety of electronic apparatuses include (but are not limited to): mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, automobile displays (e.g., odometer displays, etc.), navigators, cockpit controllers and/or displays, displays of camera views (e.g., displays of rear-view cameras in vehicles), electronic photos, electronic billboards or signs, projectors, building structures, packaging and aesthetic structures (e.g., displays for displaying an image of a piece of jewelry), etc.

Figure 11A:
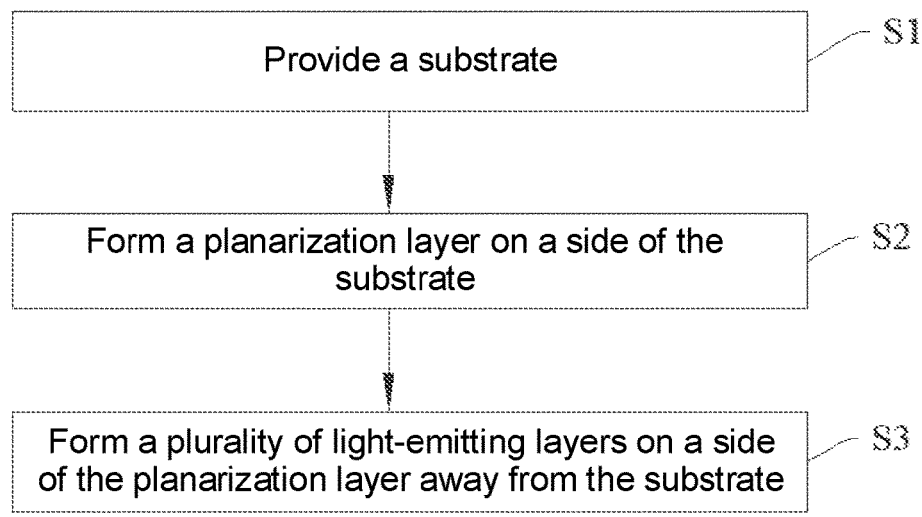
FIG. 11A is a flow diagram of a manufacturing method for a display substrate, in accordance with some embodiments of the present disclosure.

Some embodiments of the present disclosure provide a manufacturing method for the display substrate 100. As shown in FIG. 11A, the method includes following steps (S1 to S3).

In S1, a substrate is provided.

Figure 12:
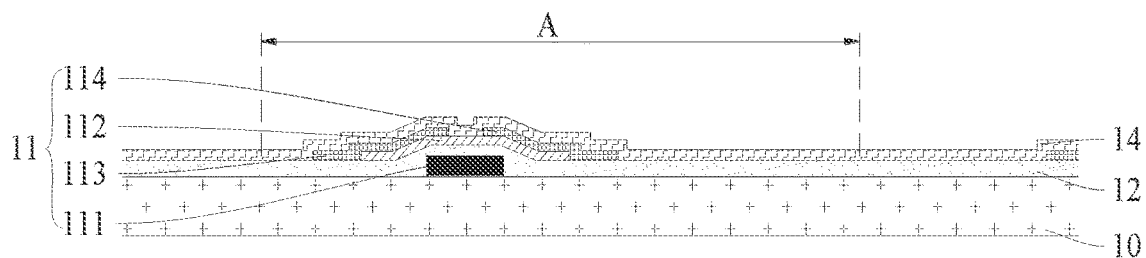
FIG. 12 is a step diagram of a manufacturing method for a substrate, in accordance with some embodiments of the present disclosure.

For example, as shown in FIG. 12, a substrate 10 is provided, and the substrate 10 has a plurality of sub-pixel regions A. A plurality of pixel driving circuits are formed on a side of the substrate 10, and each pixel driving circuit includes a plurality of thin film transistors 11. Each thin film transistor 11 includes a gate 111, an active layer 112, a source 113 and a drain 114. A gate insulating layer 12 is provided between the active layer 112 and the gate 111. A passivation layer 14 is formed on sides of the plurality of pixel driving circuits away from the substrate 10, and the passivation layer 14 covers the plurality of pixel driving circuits.

In S2, a planarization layer 13 is formed on the side of the substrate 10.

Figure 11B:
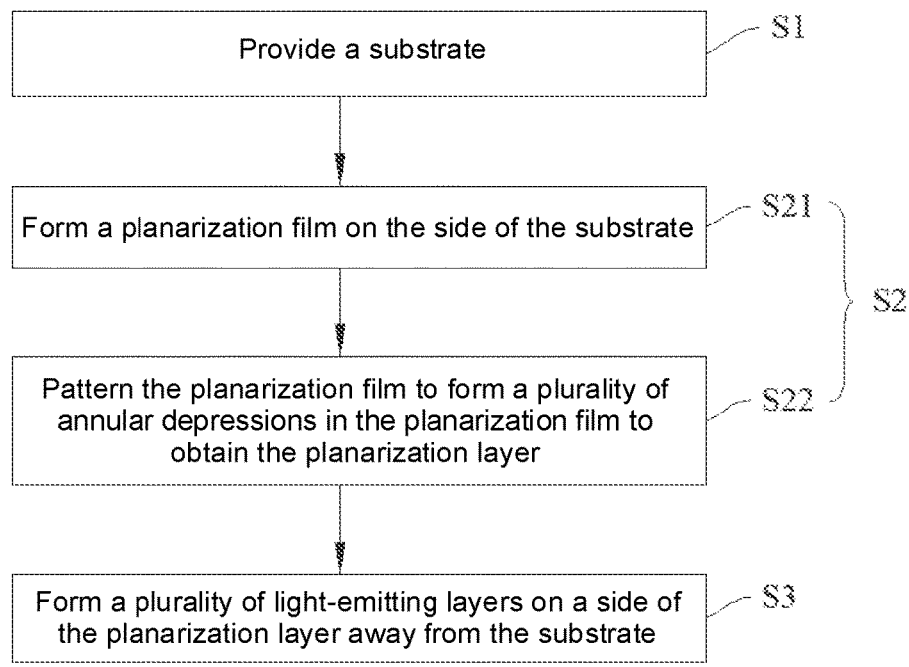
FIG. 11B is a flow diagram of a manufacturing method for another display substrate, in accordance with some embodiments of the present disclosure.

As shown in FIG. 11B, the above S2 includes steps 21 and 22 (S21 and S22).

In S21, a planarization film is formed on the side of the substrate 10.

Figure 13:
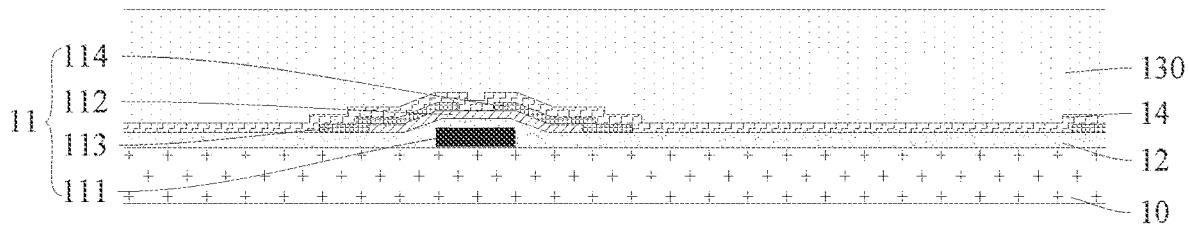
FIG. 13 is a step diagram for manufacturing a planarization layer, in accordance with some embodiments of the present disclosure.

For example, as shown in FIG. 13, the planarization film 130 is formed on the side of the passivation layer 14 away from the substrate 10 by a film coating process, and the planarization film 130 covers the plurality of pixel driving circuits on the substrate 10.

In S22, the planarization film 130 is patterned to form a plurality of annular depressions 132 in the planarization film 130 to obtain the planarization layer 13.

In some embodiments, as shown in FIGS. 14 to 17, the planarization film 130 is patterned to form the plurality of annular depressions 132 in the planarization film 130, so that the planarization layer 13 is divided into a plurality of first portions B and a second portion C by the plurality of annular depressions 132, and each annular depression 132 surrounds a first portion B. A first portion B is disposed in a sub-pixel region A, and the second portion C is located between a plurality of sub-pixel regions A.

It will be noted that, in a patterning process, a mask is used to expose the planarization film 130 to the ultraviolet light, exposure region(s) may be regions where the annular depressions 132 to be formed are located, or a region of the planarization film 130 except for the annular depressions 132 to be formed, which depends on a type of a photoresist used for the planarization film 130. If the photoresist used in the planarization film 130 is a positive photoresist, the exposure regions are the regions where the annular depressions 132 to be formed are located, and portions of the planarization film 130 located in the exposure regions are removed to obtain the annular depressions 132; if the photoresist used in the planarization film 130 is a negative photoresist, the exposure region is a portion of the planarization film 130 except for the annular depressions 132 to be formed, and portions of the planarization film 130 outside the exposure region are removed to obtain the annular depressions 132.

Figure 14:
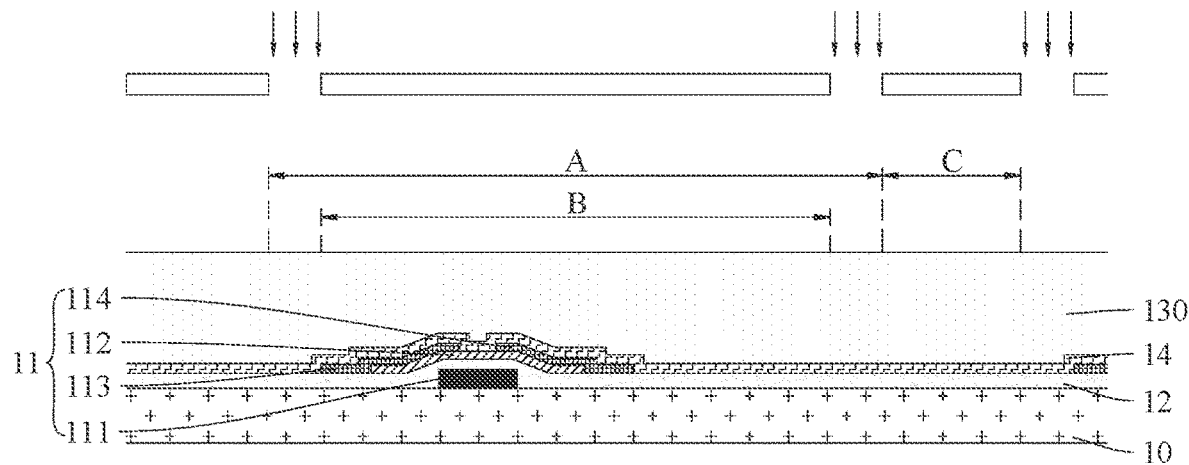
FIGS. 14 and 15 are step diagrams for manufacturing an annular depression, in accordance with some embodiments of the present disclosure.
Figure 15:
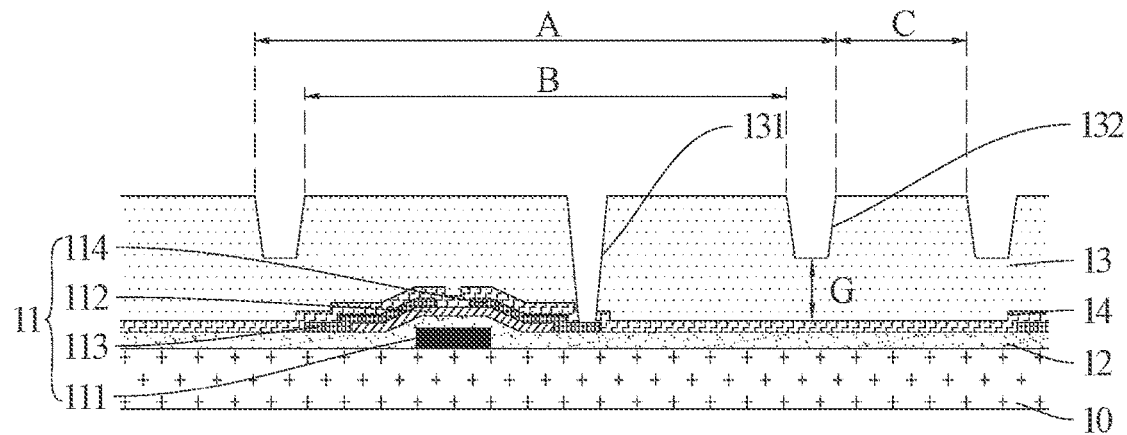

For example, as shown in FIGS. 14 and 15, in a case where the photoresist used for the planarization film 130 is the positive photoresist, the exposure regions are the regions where the annular depressions 132 are located. When portions of the planarization film 130 in the regions where the annular depressions 132 are located are exposed, an amount of light on a side of the planarization film 130 proximate to the ultraviolet light is greater than an amount of light on a side of the planarization film 130 away from the ultraviolet light, and thus, after development, a width of a side proximate to the ultraviolet light of a removed portion of the planarization film 130 is greater than a width of a side away from the ultraviolet light of a removed portion of the planarization film 130, so that an annular depression 132 in which a width of the top thereof is greater than a width of the bottom thereof, i.e., an annular depression 132 whose section is in a shape of a trapezoid, is obtained.

Figure 16:
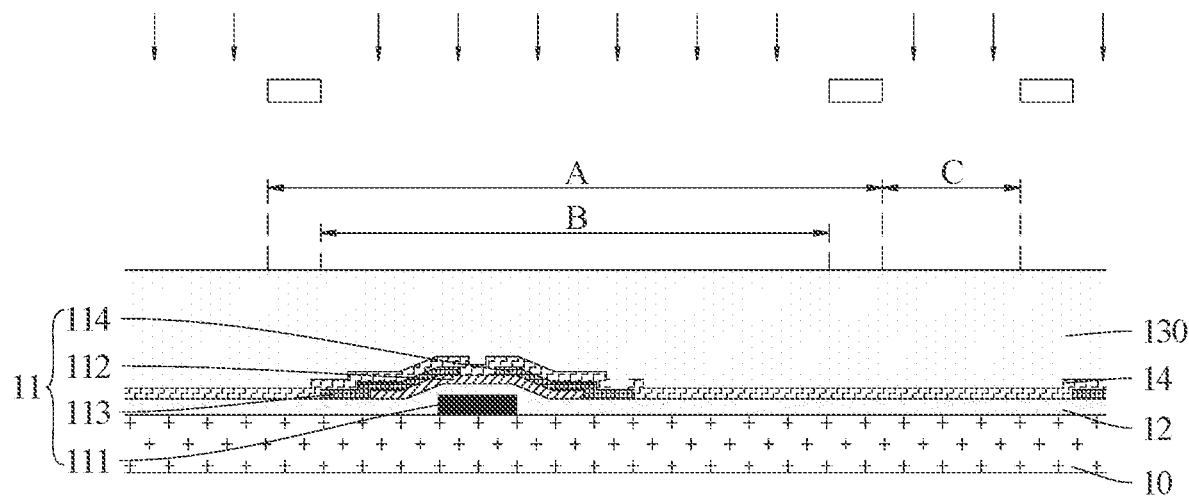
FIGS. 16 and 17 are step diagrams for manufacturing another annular depression, in accordance with some embodiments of the present disclosure.
Figure 17:
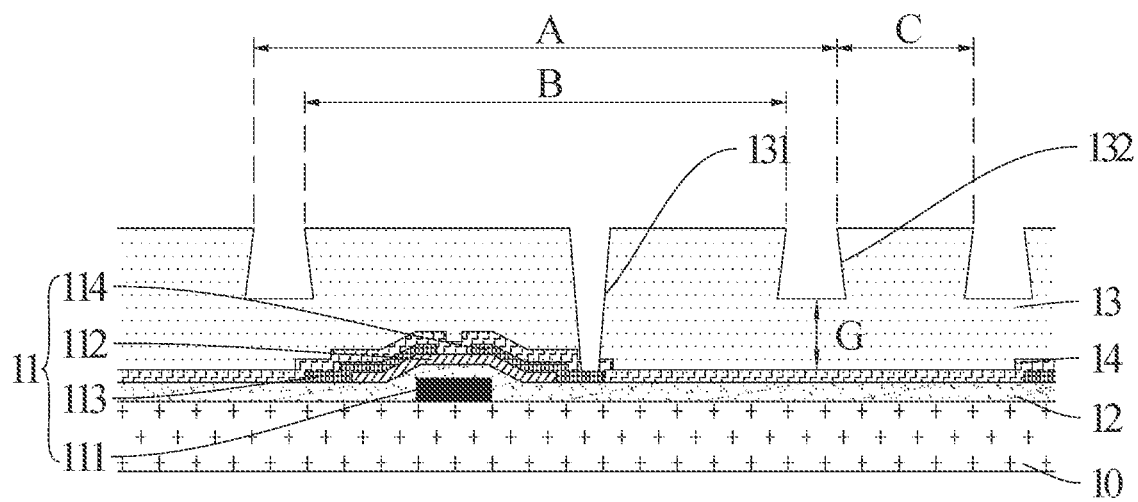

For example, as shown in FIGS. 16 and 17, in a case where the photoresist used in the planarization film 130 is the negative photoresist, the exposure region is the portion of the planarization film 130 except for the annular depressions 132. When the portion of the planarization film 130 except for the annular depressions 132 is exposed, the amount of light on the side of the planarization film 130 proximate to the ultraviolet light is greater than the amount of light on the side away from the ultraviolet light, and thus, after the development, a width of a side proximate to the ultraviolet light of the removed portion of the planarization film 130 is less than a width of a side away from the ultraviolet light of the removed portion, so that an annular depression 132 in which the width on the top thereof is less than the width on the bottom thereof, i.e., an annular depression 132 whose section is in a shape of an inverted trapezoid, is obtained.

For example, as shown in FIGS. 15 and 17, a bottom surface of the annular depression 132 and a surface of the planarization layer 13 proximate to the substrate 10 have a distance G therebetween.

A depth of a removed portion of the planarization film 130 is controlled by controlling an exposure time and a development time of the planarization film 130, so as to control a depth of the annular depression 132, prevent the annular depression 132 from penetrating the planarization layer 13, and further prevent the luminescent material ink from flowing through the annular depression 132 into the pixel driving circuit below the planarization layer 13.

Figure 18:
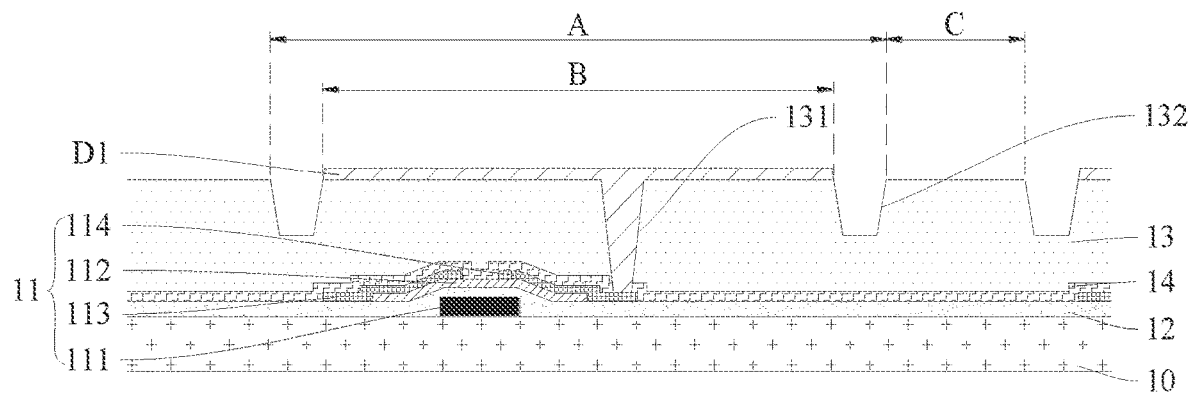
FIG. 18 is a step diagram for manufacturing a first electrode, in accordance with some embodiments of the present disclosure.

In some embodiments, as shown in FIGS. 17 and 18, in the process of patterning the planarization layer 13 by the patterning process, it is necessary to open a via hole 131 in each first portion B of the planarization layer 13. The via hole 131 exposes the source 113 or the drain 114 of the thin film transistor 11, so that a first electrode D1 subsequently formed is electrically connected to the source 113 or the drain 114 of the thin film transistor 11.

Figure 19:
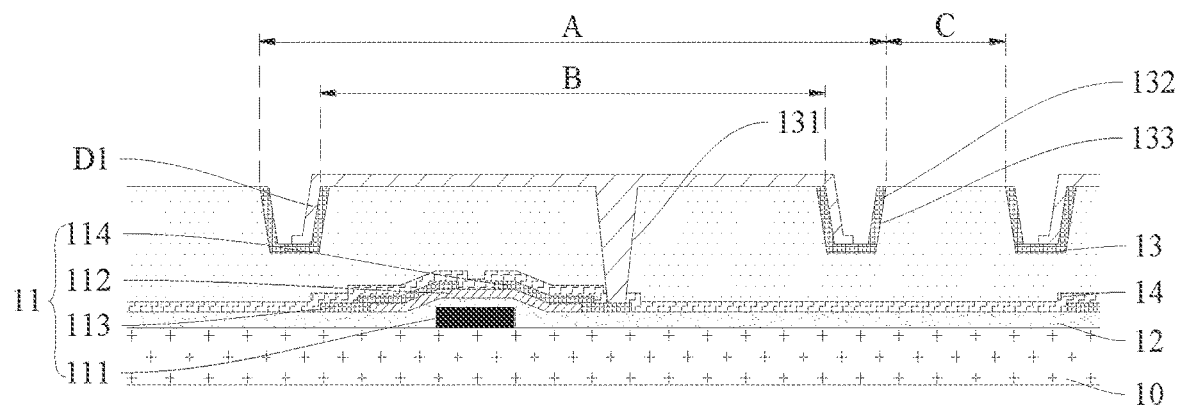
FIG. 19 is a step diagram for manufacturing anther first electrode, in accordance with some embodiments of the present disclosure.

In some embodiments, as shown in FIGS. 18 and 19, after S2 and before S3, the method further include: forming an electrode film on the side of the planarization layer 13 away from the substrate 10, and patterning the electrode film to obtain first electrodes D1.

For example, as shown in FIG. 18, a patterning process is used to remove a portion of the electrode film that does not cover the first portions B to obtain the first electrodes D1, so that an orthogonal projection of an edge of the first electrode D1 on the substrate 10 coincides or substantially coincides with an orthogonal projection of an edge of the first portion B on the substrate 10.

For example, as shown in FIG. 19, a patterning process is used to remove at least a portion of the electrode film, and a continuous portion of the electrode film on the first portion B and in the annular depression 132 is retained to obtain the first electrodes D1, so that the edge of the first electrode D1 is located in the annular depression 132.

In S3, a plurality of light-emitting layers D2 are formed on a side of the planarization layer 13 away from the substrate 10.

In some embodiments, an inkjet printing process is used to spray the luminescent material ink on a surface of the first electrode D1 away from the substrate 10; since the luminescent material ink is in contact with a flat surface, the phenomenon that the luminescent material ink shrinks inward or climbs along the sidewalls of the barrier walls 15 of the pixel definition layer in the related arts may be avoided. The luminescent material ink is dried to form the light-emitting layer D2 with a relatively uniform thickness, and the light-emitting layer D2 cover the first electrode D1.

In some embodiments, since the pixel definition layer of the display substrate 100 does not use the pixel definition layer, the display substrate 100 does not need to enter a vacuum dryer (VCD) to dry the luminescent material ink. A real-time drying method may be used to directly heat and dry the luminescent material ink on a printer table, so as to obtain the light-emitting layers D2 with a relatively uniform thickness, which simplifies the process.

Figure 20:
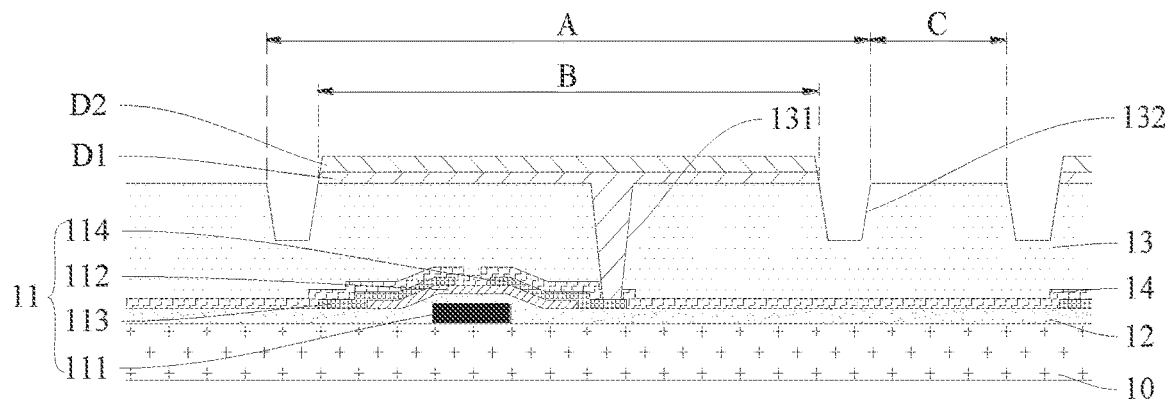
FIG. 20 is a step diagram for manufacturing a light-emitting layer, in accordance with some embodiments of the present disclosure.

For example, as shown in FIG. 20, in a case where the orthogonal projection of the edge of the first electrode D1 on the substrate 10 coincides or substantially coincides with the orthogonal projection of the edge of the first portion B on the substrate 10, the luminescent material ink is only sprayed on the surface of the first electrode D1. Therefore, the orthogonal projection, on the substrate 10, of the edge of the light-emitting layer D2 formed after drying coincides or substantially coincides with the orthogonal projection of the edge of the first portion B on the substrate 10.

Figure 21:
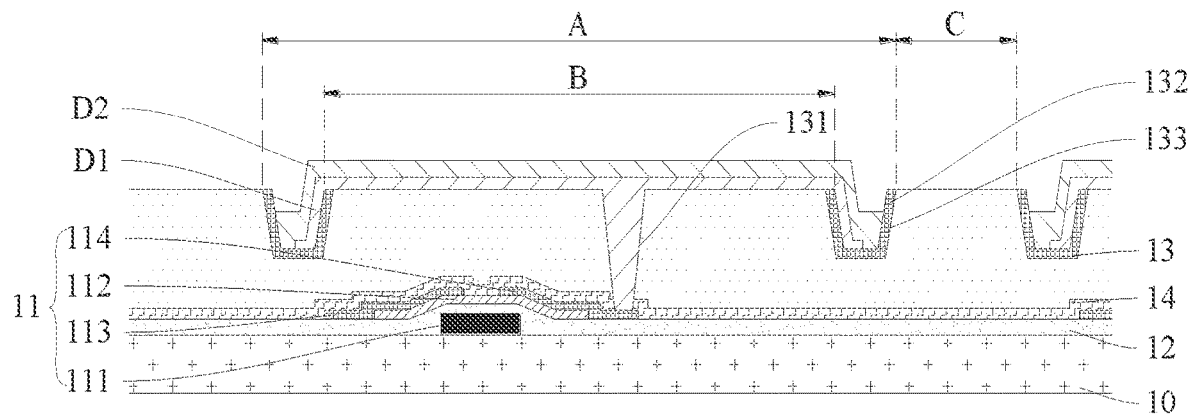
FIG. 21 is a step diagram for manufacturing another light-emitting layer, in accordance with some embodiments of the present disclosure.

For example, as shown in FIG. 21, in a case where the edge of the first electrode D1 is located in the annular depression 132, the luminescent material ink is sprayed on the surface of the first electrode D1 and flows into the annular depression 132. Therefore, an edge of a light-emitting layer D2 formed after drying is located in the annular depression 132, and the edge of the light-emitting layer D2 covers a portion of an inner surface of the annular depression 132.

For example, an amount of the luminescent material ink sprayed is controlled, so that the luminescent material ink does not overflow the annular depression 132 and flows to a surface of the second portion C.

Figure 22:
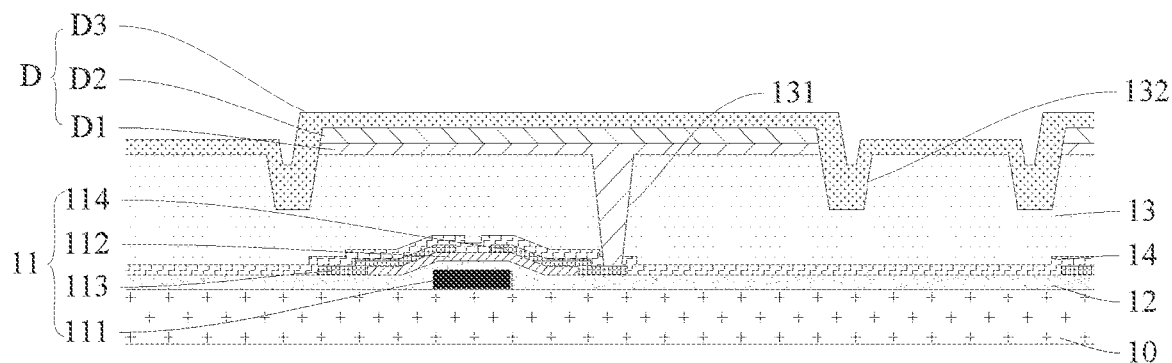
FIG. 22 is a step diagram for manufacturing a second electrode, in accordance with some embodiments of the present disclosure.

In some embodiments, as shown in FIG. 22, after S3, the method further includes: forming a second electrode D3 on sides of the light-emitting layers D2 away from the substrate 10. For example, the second electrode D3 is in a planar shape.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a plurality of sub-pixel regions; the display substrate comprising:
    a substrate;
    a planarization layer disposed on a side of the substrate, the planarization layer including a plurality of first portions and a second portion, a first portion being disposed in a sub-pixel region, and the second portion being located in a gap region between the plurality of sub-pixel regions, wherein a side surface of the first portion and a side surface of the second portion have a spacing therebetween to form an annular depression, the annular depression surrounds the first portion; and
    a plurality of light-emitting layers disposed on a side of the planarization layer away from the substrate, a light-emitting layer covering the first portion of the planarization layer;
    wherein an edge of the light-emitting layer is located within the annular depression, and a height of an upper surface of a light-emitting layer relative to the substrate in the annular depression is less than a height of an upper surface of the light-emitting layer relative to the substrate in the first portion.

2. The display substrate according to claim 1, wherein a material of the planarization layer includes a lyophobic material.

3. The display substrate according to claim 1, further comprising:
    a lyophobic material layer covering at least a portion of an inner surface of the annular depression proximate to the second portion.

4. The display substrate according to claim 1, further comprising:
    a first electrode located between the planarization layer and the light-emitting layer.

5. The display substrate according to claim 4, wherein an edge of the first electrode is located in the annular depression.

6. The display substrate according to claim 4, wherein an orthogonal projection of an edge of the first electrode on the substrate substantially coincides with an orthogonal projection of an edge of the first portion on the substrate.

7. The display substrate according to claim 4, wherein a material of the first electrode includes a lyophilic material.

8. The display substrate according to claim 1, wherein a section of the annular depression is in a shape of an inverted trapezoid, and a length of a bottom base of the inverted trapezoid proximate to the substrate is less than a length of a top base of the inverted trapezoid away from the substrate.

9. The display substrate according to claim 1, wherein a section of the annular depression is in a shape of a trapezoid, and a length of a bottom base of the trapezoid proximate to the substrate is greater than a length of a top base of the trapezoid away from the substrate.

10. The display substrate according to claim 1, wherein a surface of the first portion away from the substrate and a side surface of the annular depression proximate to the first portion have a rounded corner.

11. The display substrate according to claim 1, wherein a bottom surface of the annular depression and a surface of the planarization layer proximate to the substrate have a distance therebetween.

12. The display substrate according to claim 1, wherein a ratio of a depth of the annular depression to a thickness of the light-emitting layer is in a range from approximately 1.5 to approximately 5.

13. A display apparatus, comprising:
    the display substrate according to claim 1.

14. A manufacturing method for a display substrate, comprising:
    providing a substrate; the substrate having a plurality of sub-pixel regions;
    forming a planarization film on a side of the substrate;
    patterning the planarization film to form a plurality of annular depressions in the planarization film to obtain a planarization layer; wherein the planarization layer is divided into a plurality of first portions and a second portion by the plurality of annular depressions, an annular depression surrounds a first portion, the first portion is disposed in a sub-pixel region, and the second portion is located in a gap region between the plurality of sub-pixel regions; and
    forming a plurality of light-emitting layers on a side of the planarization layer away from the substrate; a light-emitting layer covering the first portion of the planarization layer;
    wherein an edge of the light-emitting layer is located within the annular depression, and a height of an upper surface of a light-emitting layer relative to the substrate in the annular depression is less than a height of an upper surface of the light-emitting layer relative to the substrate in the first portion.

15. The manufacturing method according to claim 14, wherein forming the plurality of light-emitting layers on the side of the planarization layer away from the substrate includes:
    inkjet printing luminescent material ink on the side of the planarization layer away from the substrate; and
    drying the luminescent material ink to form the plurality of light-emitting layers.

16. The display substrate according to claim 3, wherein the lyophobic material layer covers the entire inner surface of the annular depression.

* * * * *